United States Patent
Chen et al.

(10) Patent No.: US 12,183,550 B2
(45) Date of Patent: Dec. 31, 2024

(54) WAFER TREATMENT SYSTEM AND METHOD OF TREATING WAFER

(71) Applicant: TAIWAN SEMICONDUCTOR MANUFACTURING COMPANY LIMITED, Hsin-Chu (TW)

(72) Inventors: Po Hsun Chen, Tainan (TW); Chun-Wei Chou, Keelung (TW); Keng-Ying Liao, Tainan (TW); Tzu-Pin Lin, Tainan (TW); Tai-Chin Wu, Tainan (TW); Su-Yu Yeh, Tainan (TW); Po-Zen Chen, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 420 days.

(21) Appl. No.: 17/186,041

(22) Filed: Feb. 26, 2021

(65) Prior Publication Data

US 2022/0277933 A1 Sep. 1, 2022

(51) Int. Cl.
*H01J 37/32* (2006.01)
*H01L 21/3065* (2006.01)
*H01L 21/67* (2006.01)

(52) U.S. Cl.
CPC .... *H01J 37/3244* (2013.01); *H01J 37/32082* (2013.01); *H01J 37/32715* (2013.01);
(Continued)

(58) Field of Classification Search
CPC ............ H01J 37/3244; H01J 37/32082; H01J 37/32091; H01J 37/321; H01J 37/32449;
(Continued)

(56) References Cited

U.S. PATENT DOCUMENTS 5,241,245 A * 8/1993 Barnes ................... H01J 37/321
315/111.41
6,068,784 A * 5/2000 Collins ................. H01J 37/321
257/E21.252
(Continued)

FOREIGN PATENT DOCUMENTS

CN 101642001 A 2/2010
CN 104823294 A 8/2015
(Continued)

OTHER PUBLICATIONS

Office Action received in corresponding Chinese patent application No. 202110530051.5, dated Nov. 6, 2024, 22 pages.

*Primary Examiner* — Benjamin Kendall
*Assistant Examiner* — Joshua Reyes
(74) *Attorney, Agent, or Firm* — Cooper Legal Group, LLC

(57) ABSTRACT

A wafer treatment system is provided. The wafer treatment system includes a wafer treatment chamber defining a treatment area within which a wafer is treated. The wafer treatment system includes a gas injection system. The gas injection system includes a gas injector configured to inject a first gas, used for treatment of the wafer, into the treatment area. A first gas tube is configured to conduct the first gas at a first temperature to the gas injector. The gas injection system includes a heating enclosure enclosing the gas injector. A second gas tube is configured to conduct a heated gas to the heating enclosure to increase an enclosure temperature at the heating enclosure to a second enclosure temperature. A temperature of the first gas is increased in the gas injector from the first temperature to a second temperature due to the second enclosure temperature at the heating enclosure.

20 Claims, 5 Drawing Sheets

(52) U.S. Cl.
CPC .... *H01L 21/3065* (2013.01); *H01L 21/67069* (2013.01); *H01J 2237/334* (2013.01)

(58) Field of Classification Search
CPC .......... H01J 37/32715; H01J 2237/334; H01L 21/67017; H01L 21/67069; H01L 21/6833; H01L 21/3065; C23C 16/0227; C23C 16/0236; C23C 16/0245; C23C 16/45512; C23C 16/45563; C23C 16/45565; C23C 16/45568; C23C 16/4557; C23C 16/45572; C23C 16/45574; C23C 16/45576; C23C 16/45578; C23C 16/4558; C23C 16/45587; C23C 16/5055
See application file for complete search history.

(56) References Cited

U.S. PATENT DOCUMENTS

| | | | | |
|---|---|---|---|---|
| 6,401,652 | B1* | 6/2002 | Mohn | H01J 37/321 |
| | | | | 118/723 AN |
| 7,722,737 | B2* | 5/2010 | Gondhalekar | C23C 16/4558 |
| | | | | 156/345.33 |
| 2005/0145341 | A1* | 7/2005 | Suzuki | H01J 37/321 |
| | | | | 156/345.49 |
| 2008/0099441 | A1 | 5/2008 | Carr | |
| 2011/0056626 | A1* | 3/2011 | Brown | H01J 37/321 |
| | | | | 156/345.33 |
| 2013/0018500 | A1* | 1/2013 | Porthouse | G05D 16/2046 |
| | | | | 700/104 |
| 2014/0060738 | A1* | 3/2014 | Kim | H01J 37/321 |
| | | | | 156/345.48 |
| 2014/0083361 | A1* | 3/2014 | Rocha-Alvarez | H01L 21/6719 |
| | | | | 118/723 E |
| 2014/0106477 | A1* | 4/2014 | Chen | H01L 22/26 |
| | | | | 702/191 |
| 2014/0178604 | A1* | 6/2014 | Selwyn | H01J 37/32422 |
| | | | | 118/723 ER |
| 2015/0318146 | A1* | 11/2015 | Kim | H01J 37/3244 |
| | | | | 427/574 |
| 2018/0266017 | A1* | 9/2018 | Park | H01L 21/67017 |
| 2019/0309419 | A1* | 10/2019 | Baluja | C23C 16/45536 |
| 2019/0385816 | A1* | 12/2019 | Hsu | H01L 21/67069 |
| 2020/0251312 | A1 | 8/2020 | Liu | |

FOREIGN PATENT DOCUMENTS

| | | |
|---|---|---|
| CN | 105047527 A | 11/2015 |
| JP | 2009224457 A | 10/2009 |

* cited by examiner

WAFER TREATMENT SYSTEM AND METHOD OF TREATING WAFER

BACKGROUND

Semiconductor wafers are used in a multitude of electronic devices, such as mobile phones, laptops, desktops, tablets, watches, gaming systems, and various other industrial, commercial, and consumer electronics. Semiconductor wafers generally undergo one or more treatments to produce desired features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
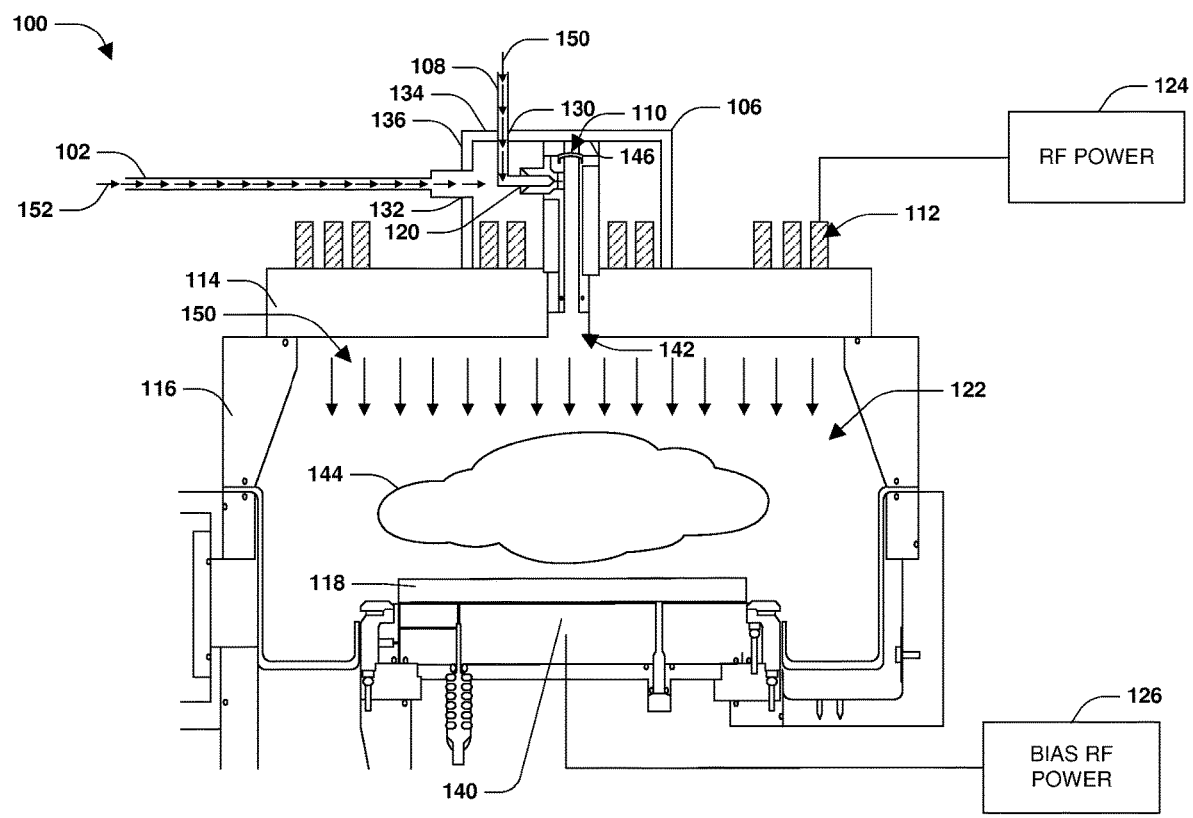
FIG. 1 illustrates a cross-sectional view of at least some of a wafer treatment system, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

A wafer treatment system has a wafer treatment chamber and a gas injection system. The gas injection system has a gas injector, coupled to the wafer treatment chamber, configured to inject a first gas into a treatment area defined by the wafer treatment chamber. The first gas is used for treatment of a wafer contained in the treatment area. The gas injection system has a heating enclosure enclosing the gas injector, and a gas tube configured to conduct a heated gas to the heating enclosure to increase an enclosure temperature at the heating enclosure from a first enclosure temperature to a second enclosure temperature. A temperature of the first gas is increased in the gas injector from a first temperature to a second temperature due to the second enclosure temperature at the heating enclosure. Implementing the gas injection system having the heating enclosure at the second enclosure temperature to increase the temperature of the first gas from the first temperature to the second temperature inhibits liquefaction and/or crystallization of the first gas and thus reduces non-gaseous content of the first gas, such as at least one of liquid or solid content, injected into the treatment area, as compared to wafer treatment systems that do not use the heated gas and/or the heating enclosure to increase the temperature of the first gas to the second temperature. Implementing the gas injection system having the heating enclosure at the second enclosure temperature at least one of reduces or prevents polymer formation from content of the first gas on the wafer and/or in the wafer treatment chamber. The gas injection system thereby reduces and/or prevents production of wafer defects associated with polymer formation during the treatment. Given the reduced polymer formation, the wafer treatment system operates more efficiently than other wafer treatment systems, such as requiring less cleaning and/or maintenance of the wafer treatment chamber, producing fewer wafer defects in wafers, etc.

FIG. 1 illustrates a wafer treatment system 100 according to some embodiments. The view depicted in FIG. 1 is a cross-sectional view to illustrate some internal aspects of the wafer treatment system 100. The wafer treatment system 100 comprises a wafer treatment chamber 116 defining a treatment area 122 within which a wafer 118 is treated. The wafer treatment system 100 is configured to treat the wafer 118, such as for fabrication of one or more semiconductor devices. Treatment of the wafer 118 in the treatment area 122 can include at least one of etching, such as reactive-ion etching, passivation, sputtering, surface cleaning, chemical vapor deposition (CVD), etc. In some embodiments, the treatment is performed using plasma established in the treatment area 122. Other treatments of the wafer 118 are within the scope of the present disclosure.

The wafer treatment system 100 comprises a gas injection system configured to inject a first gas 150 into the treatment area 122. The first gas 150 is used for treatment of the wafer 118 in the treatment area 122. The first gas 150 comprises at least one of silicon fluoride (SiF) such as silicon tetrafluoride (SiF4), silicon bromide (SiBr) such as silicon tetrabromide (SiBr4), silicon chloride (SiCl) such as silicon tetrachloride (SiCl4), silicon iodide (SiI) such as silicon tetraiodide (SiI4), or other suitable gas. The gas injection system comprises a first gas tube 108, a second gas tube 102, a gas injector 110, and a heating enclosure 106.

The gas injector 110 is coupled to the wafer treatment chamber 116. The gas injector 110 overlies a plate 114 of the wafer treatment chamber 116. The plate 114 corresponds to at least one of a disc, a window, a shower head, a blocker plate, or other suitable component. The plate 114 comprises at least one of quartz or other suitable material. The gas injector 110 is configured to inject the first gas 150 into the treatment area 122. Other structures and/or configurations of the gas injector 110 and/or the plate 114 are within the scope of the present disclosure.

The heating enclosure 106 encloses the gas injector 110. The heating enclosure 106 defines a first opening 130 through which the first gas tube 108 extends into the heating enclosure 106. The first opening 130 is defined in a top 134 of the heating enclosure 106 or other portion of the heating enclosure 106. The top 134 of the heating enclosure 106 at least one of overlies the gas injector 110, is in direct contact with the gas injector 110, or is in indirect contact with the gas injector 110. In some embodiments, an inner surface of the top 134 of the heating enclosure 106 is in direct contact with a top surface 146 of the gas injector 110. In some embodiments, a space, such as comprising at least one of air or other gas, exists between the inner surface of the top 134 of the heating enclosure 106 and the top surface 146 of the gas injector 110.

The first gas tube 108 is configured to conduct the first gas 150 at a first temperature to the gas injector 110. The first gas tube 108 is fluidly coupled to the gas injector 110 at a first location 120. The first location 120 generally corresponds to a location where the first gas 150 exits the first gas tube 108 and enters the gas injector 110. One or more valves, sealants, O-rings, etc. can exist at the first location 120 to afford control over the flow of the first gas 150 from the first gas tube 108 to the gas injector 110.

The second gas tube 102 is configured to conduct a heated gas 152 to the heating enclosure 106. The second gas tube 102 is fluidly coupled to the heating enclosure 106 at a second location 132. The second location 132 is at a sidewall 136 of the heating enclosure 106 or other portion of the heating enclosure 106. The heated gas 152 flows from the second gas tube 102, through an opening in the heating enclosure 106 at the second location 132, into the heating enclosure 106. The first gas 150 is isolated from the heated gas 152 such that at least one of the heated gas 152 does not enter the gas injector 110 or the first gas 150 and the heated gas 152 do not mix. Other structures and/or configurations of the heating enclosure 106, the first gas tube 108, the gas injector 110, and/or the second gas tube 102 are within the scope of the present disclosure.

The heated gas 152 comprises at least one of heated clean dry air (CDA) or other suitable gas. The heated gas 152 entering the heating enclosure 106 increases an enclosure temperature at the heating enclosure 106 from a first enclosure temperature to a second enclosure temperature. The enclosure temperature is at least one of a temperature of an inner surface of the heating enclosure 106, a temperature of an outer surface of the heating enclosure 106, a temperature of the gas injector 110 in the heating enclosure 106, a temperature of a portion of the first gas tube 108 in the heating enclosure 106, a temperature of a location where the heating enclosure 106 is in contact with the gas injector 110, or a temperature of a space, such as comprising at least one of air or the heated gas 152, between the inner surface of the heating enclosure 106 and the gas injector 110.

The second enclosure temperature at the heating enclosure 106 causes a temperature of the first gas 150 at least one of in the gas injector 110 or in a portion of the first gas tube 108 in the heating enclosure 106 to increase from the first temperature to a second temperature. Heat or energy of the heated gas 152 transfers to the first gas 150 at least one of in the gas injector 110 or in the portion of the first gas tube 108 in the heating enclosure 106 such that the temperature of the first gas 150 increases to the second temperature.

The first gas 150 is at a first pressure in the gas injector 110. The first gas 150 is in a gaseous state at the first pressure and the second temperature. The first gas 150 is at a second pressure in at least a portion of the first gas tube 108. In some embodiments, the first gas 150 is in a non-gaseous state at the second pressure and the first temperature. The non-gaseous state corresponds to a state of the first gas 150 in which matter of the first gas 150 is at least one of partly gaseous, at least partly liquid, or at least partly solid. In some embodiments, the second pressure is the same as the first pressure. In some embodiments, the second pressure is different than the first pressure. The second temperature at least one of exceeds or is about equal to a boiling point of the first gas 150 at the first pressure such that the first gas 150 in the gas injector 110 is in the gaseous state. In some embodiments, the first gas 150 comprises a single compound. In some embodiments, the first gas 150 comprises multiple compounds, such as a mixture of gases, where each gas of the mixture of gases has a different boiling point at the first pressure. The second temperature at least one of exceeds or is about equal to a highest boiling point of different boiling points of the mixture of gases at the first pressure. In some embodiments, the second temperature is at least 56 degrees Celsius. Other values of the second temperature are within the scope of the present disclosure.

The gas injector 110 is configured to inject the first gas 150 into the treatment area 122. The first gas 150 is in the gaseous state when injected into the treatment area 122, such as due to the temperature of the first gas 150 being increased from the first temperature to the second temperature. The first gas 150 flows through at least one of the gas injector 110 or the plate 114 and enters the treatment area 122. In some embodiments, the first gas 150 flows from the gas injector 110 to the treatment area 122 via one or more openings 142 in the plate 114. The plate 114 provides for generally uniform flow or distribution of the first gas 150 into the treatment area 122. At least a portion of the gas injector 110 overlies the one or more openings 142. Other structures and/or configurations of the gas injector 110 and/or the plate 114 are within the scope of the present disclosure.

The wafer treatment chamber 116 comprises one or more transformer coupled plasma (TCP) coils 112 that overlie the plate 114. The wafer treatment system 100 comprises a radio frequency (RF) power generator 124 electrically coupled to the one or more TCP coils 112. The wafer treatment system 100 comprises a bias RF power generator 126 coupled to the wafer treatment chamber 116. In some embodiments, the bias RF power generator 126 is coupled to a wafer support 140 in the wafer treatment chamber 116. The wafer support 140 is configured to support the wafer 118 in the treatment area 122. The wafer support 140 comprises at least one of a wafer chuck, an electrostatic chuck, or other suitable structure. Other structures and/or configurations of the one or more TCP coils 112, the RF power generator 124, the bias RF power generator 126, and/or the wafer support 140 are within the scope of the present disclosure.

The wafer treatment system 100 is configured to establish a plasma 144 in the wafer treatment chamber 116 from the first gas 150. The plasma 144 is used for the treatment of the wafer 118, such as for etching the wafer 118. The wafer treatment system 100 establishes the plasma 144 using at least one of the one or more TCP coils 112, the RF power generator 124, and/or the bias RF power generator 126. The RF power generator 124 generates first RF power, such as having a frequency between about 12 MHz to about 15 Mhz or other suitable frequency, and applies the first RF power to the one or more TCP coils 112. The first RF power applied to the one or more TCP coils 112 generates an electromagnetic field to establish the plasma 144 from the first gas 150, such as by at least one of accelerating electrons of the first gas 150 or ionizing the first gas 150. The bias RF power generator 126 generates bias RF power, such as having a frequency between about 12 MHz to about 15 Mhz or other suitable frequency, and applies the bias RF power to the wafer support 140. In some embodiments, the bias RF power generator 126 controls the bias RF power to at least one of control an ion bombardment force in the wafer treatment chamber 116 or to obtain one or more desired treatment properties of the treatment, such as at least one of one or more etch properties or one or more other treatment properties. Interactions among the one or more TCP coils 112, the RF power generator 124, the bias RF power generator 126, and/or the wafer support 140 are within the scope of the present disclosure.

In some embodiments, the heating enclosure 106 comprises a non-conductive material. The non-conductive material of the heating enclosure 106 comprises at least one of polytetrafluoroethylene (PTFE) or other suitable material. In some embodiments, the second gas tube 102 comprises a non-conductive material. The non-conductive material of the second gas tube 102 comprises at least one of PTFE or other suitable material. The heating enclosure 106 and/or the second gas tube 102 do not influence the electromagnetic field or have a reduced influence on the electromagnetic field as compared to tubes and/or enclosures of other wafer treatment systems comprising conductive materials. Other structures and/or configurations of the heating enclosure 106 and/or the second gas tube 102 are within the scope of the present disclosure.

In some embodiments, the heating enclosure 106 comprises an exhaust (not shown) configured to conduct at least some of the heated gas 152 from the heating enclosure 106 to outside the heating enclosure 106. In some embodiments, the gas injection system comprises a third gas tube (not shown) configured to conduct at least some of the heated gas 152 exhausted from the heating enclosure 106. In some embodiments, at least some of the heated gas 152 is repurposed, recycled, etc. to heat one or more other items and/or to continue to heat the heating enclosure 106. Other structures and/or configurations of the heating enclosure 106, the exhaust, and/or the third gas tube are within the scope of the present disclosure.

Figure 2:
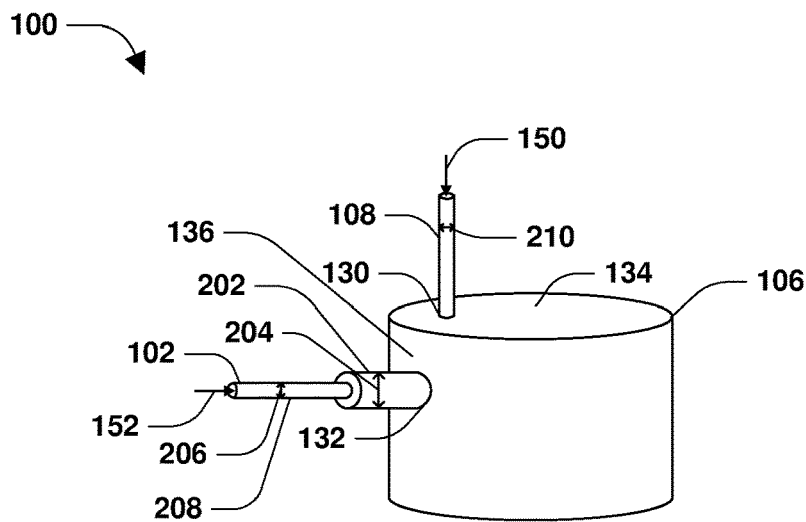
FIG. 2 illustrates a perspective view of at least some of a wafer treatment system, in accordance with some embodiments.

FIG. 2 illustrates a perspective view of the heating enclosure 106, the first gas tube 108, and the second gas tube 102 of the wafer treatment system 100, according to some embodiments. In some embodiments, the heating enclosure 106 has a cylindrical shape. In some embodiments, a width 204 of a first portion 202 of the second gas tube 102 is greater than a width 206 of a second portion 208 of the second gas tube 102. In some embodiments, the width 204 of the first portion 202 of the second gas tube 102 is less than or about equal to the width 206 of the second portion 208 of the second gas tube 102. In some embodiments, a width 210 of the first gas tube 108 is about equal to the width 206 of the second portion 208 of the second gas tube 102. In some embodiments, the width 210 of the first gas tube 108 is different than the width 206 of the second portion 208 of the second gas tube 102. Other shapes, structures, and/or configurations of the heating enclosure 106, the first gas tube 108, and/or the second gas tube 102 are within the scope of the present disclosure.

Figure 3:
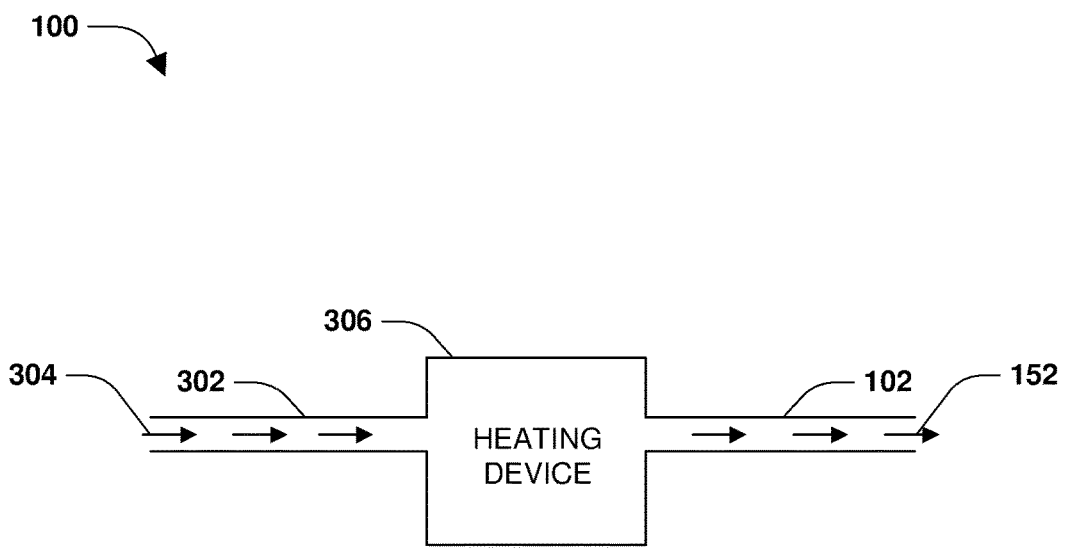
FIG. 3 illustrates a schematic view of at least some of a wafer treatment system, in accordance with some embodiments.

FIG. 3 illustrates a schematic view of a heating device 306 of the wafer treatment system 100, according to some embodiments. In some embodiments, the gas injection system comprises a fourth gas tube 302 configured to conduct a second gas 304 to the heating device 306. The second gas 304 comprises at least one of CDA or other suitable gas. The heating device 306 heats the second gas 304 to produce the heated gas 152. In some embodiments, the heating device 306 comprises a heating coil (not shown) configured to heat the second gas 304 as the second gas 304 flows through the heating device 306 to produce the heated gas 152. In some embodiments, the heating device 306 is coupled to the second gas tube 102 such that the heated gas 152 exits the heating device 306 and enters the second gas tube 102. Other structures and/or configurations of the heating device 306, the fourth gas tube 302, and/or the second gas tube 102 are within the scope of the present disclosure.

In some embodiments, the heating device 306 is configured to heat the second gas 304 to produce the heated gas 152 having a heating gas temperature. In some embodiments, the heating device 306 controls the heating gas temperature based upon one or more feedback signals. The one or more feedback signals comprise at least one of one or more pressure signals, one or more temperature signals, or one or more other suitable signals. In some embodiments, the one or more pressure signals are received from one or more pressure sensors configured to measure one or more pressures, such as at least one of the first pressure of the first gas 150 in the gas injector 110 or the second pressure of the first gas 150 in the first gas tube 108. The one or more pressure sensors comprise at least one of a pressure sensor positioned in or on the gas injector 110, a pressure sensor in or on the first gas tube 108, or a pressure sensor positioned at another suitable location. The one or more pressure signals are indicative of the one or more pressures. In some embodiments, the one or more temperature signals are received from one or more temperature sensors configured to measure one or more temperatures, such as at least one of the enclosure temperature, a temperature of the first gas 150 in the gas injector 110, a temperature of the first gas 150 in the first gas tube 108, a temperature of the first gas tube 108, a temperature of the gas injector 110, a temperature of an outer surface of the heating enclosure 106, a temperature of an inner surface of the heating enclosure 106, a temperature of the second gas tube 102, a temperature of the heated gas 152 in the second gas tube 102, a temperature of the heated gas 152 in the gas injector 110, a temperature of a space, such as filled with the heated gas 152, between the inner surface of the heating enclosure 106 and the gas injector 110, or a temperature at another suitable location of the wafer treatment system 100. The one or more temperature sensors comprise at least one of a temperature sensor positioned in or on the gas injector 110, a temperature sensor positioned in or on the first gas tube 108, a temperature sensor positioned in or on the second gas tube 102, a temperature sensor positioned in or on the heat enclosure 106, or a temperature sensor positioned at another suitable location. The one or more temperature signals are indicative of the one or more temperatures. The heating device 306 controls the heating gas temperature of the heated gas 152 based upon at least one of a composition of the first gas 150 or the one or more feedback signals such that the second temperature of the first gas 150 at least one of exceeds or is about equal to a boiling point of the first gas 150 to inhibit liquefaction and/or crystallization of the first gas 150 and to maintain the gaseous state of the first gas 150. Other structures and/or configurations of the heating device 306, the one or more pressure sensors, and/or the one or more temperature sensors are within the scope of the present disclosure.

Figure 4:
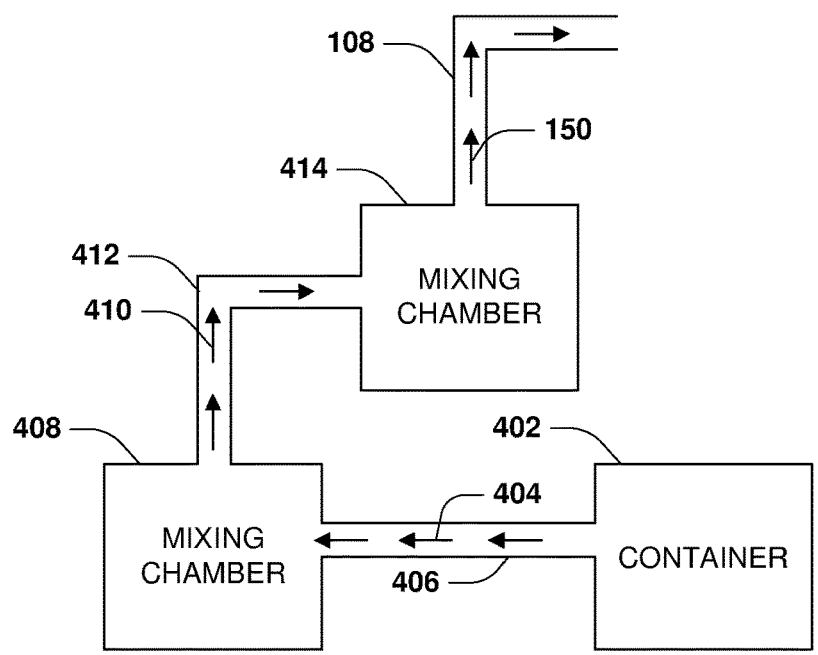
FIG. 4 illustrates a schematic view of at least some of a wafer treatment system, in accordance with some embodiments.

FIG. 4 illustrates a schematic view of a container 402 and one or more mixing chambers of the wafer treatment system 100, according to some embodiments. The container 402 is configured to store a processing gas 404. In some embodiments, the processing gas 404 is mixed with one or more gases, such as using the one or more mixing chambers, to produce the first gas 150. The one or more mixing chambers comprise at least one of a first mixing chamber 408, a second mixing chamber 414, or one or more other mixing chambers. The processing gas 404 is conducted, via a fifth gas tube 406, to the first mixing chamber 408. The first mixing chamber 408 is configured to mix the processing gas 404 with one or more first gases to produce a second processing gas 410 comprising a mixture of the processing gas 404 with the one or more first gases. The second processing gas 410 is conducted, via a sixth gas tube 412, to the second mixing chamber 414. The second mixing chamber 414 is configured to mix the second processing gas 410 with one or more second gases to produce the first gas 150 comprising a mixture of the second processing gas 410 with the one or more second gases. In some embodiments, the second mixing chamber 414 is coupled to the first gas tube 108 such that the first gas 150 exits the second mixing chamber 414 and enters the first gas tube 108. In some embodiments, a pressure of the first gas 150 in the first gas tube 108 is higher than a pressure of the processing gas 404 in the fifth gas tube 406, such as due to mixing the processing gas 404 with at least one of the one or more first gases or the one or more second gases. In some embodiments, a boiling point of the processing gas 404 in the first gas 150 in the first gas tube 108 is higher than a boiling point of the processing gas 404 in the fifth gas tube 406, such as due to the higher pressure of the first gas 150 in the first gas tube 108 than the processing gas 404 in the fifth gas tube 406. Thus, a temperature required to maintain a gaseous state of the first gas 150 in the first gas tube 108 is higher than a temperature required to maintain a gaseous state of the processing gas 404 in the fifth gas tube 406. The boiling point of the processing gas 404 is the highest boiling point among one or more boiling points of one or more gases in the first gas 150. In some embodiments, the heating device 306 controls the heating gas temperature of the heated gas 152 such that the second temperature of the first gas 150 at least one of exceeds or is about equal to a temperature required to inhibit liquefaction and/or crystallization of the processing gas 404 and to maintain the gaseous state of the processing gas 404. Accordingly, the first gas 150 is in the gaseous state and little to none of the first gas 150 is in liquid or solid form when injected into the treatment area 122. Other structures and/or configurations of the container 402, the one or more mixing chambers, and/or the first gas 150 are within the scope of the present disclosure.

In some wafer treatment systems, one or more parts of a wafer treatment chamber, such as a quartz disc of the wafer treatment chamber, is heated directly, such as using heating tape. Application of the heating tape with higher than a threshold temperature can cause damage to at least one of the quartz disc, other parts of the wafer treatment chamber, or a wafer contained in the wafer treatment chamber. The heating tape having a temperature higher than the threshold temperature can cause at least one of a substrate, a photoresist, or other aspects formed in and/or on the wafer to crack. The temperature of the heating tape can be set to below the threshold temperature such that the heating tape does not cause damage to at least one of the quartz disc, other parts of the wafer treatment chamber, or the wafer. However, the temperature of the heating tape below the threshold temperature can be insufficient to maintain a gaseous state of a processing gas used in the wafer treatment chamber. Thus, the processing gas that enters the wafer treatment chamber is at least partly liquid or at least partly solid causing at least one of polymer formation, damage to the wafer treatment chamber, or defects in and/or on the wafer. By implementing the wafer treatment system 100 with the heating enclosure 106 and by using the heated gas 152 to increase the enclosure temperature at the heating enclosure 106, the temperature of the first gas 150 can be maintained at the second temperature at or above the boiling point of the first gas 150 without causing damage to the wafer 118, the plate 114 and/or other parts of the wafer treatment system 100. Further, by maintaining the temperature of the first gas 150 at the second temperature at or above the boiling point of the first gas 150, the wafer treatment system 100 can treat the wafer 118 with little to no polymer formation and/or little to no wafer defects in and/or on the wafer 118.

Figure 5:
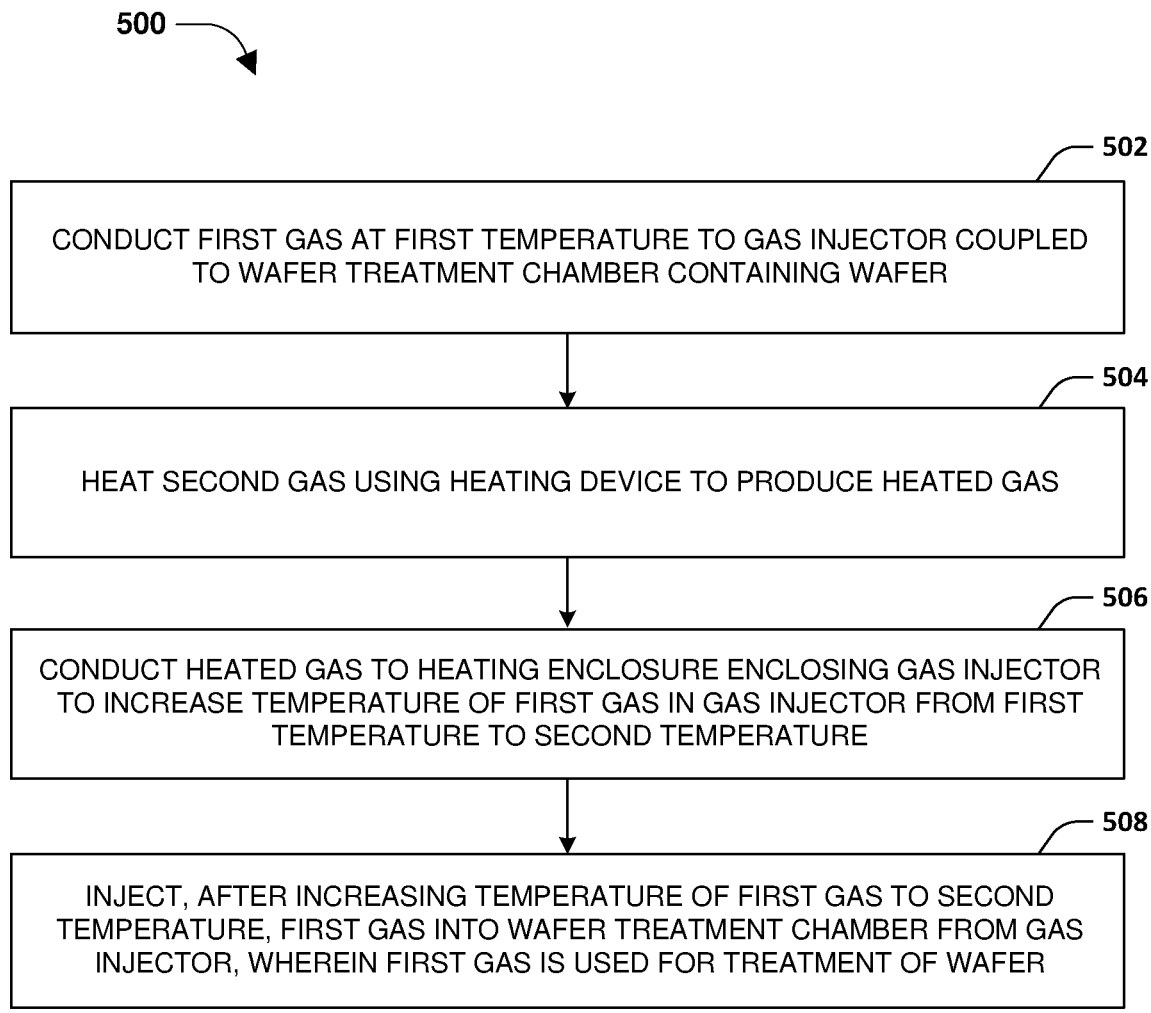
FIG. 5 is a flow diagram illustrating a method of controlling a temperature of a first gas used for treating a wafer, in accordance with some embodiments.

A method 500 of controlling a temperature of a first gas used for treating a wafer, such as at least one of the wafer 118 or other suitable wafer, is illustrated in FIG. 5, in accordance with some embodiments. The first gas is at least one of the first gas 150 or other suitable gas. At 502, the first gas at a first temperature is conducted to a gas injector coupled to a wafer treatment chamber containing the wafer. The gas injector is at least one of the gas injector 110 or other suitable gas injector. The wafer treatment chamber is at least one of the wafer treatment chamber 116 or other suitable wafer treatment chamber. In some embodiments, the first gas is conducted to the gas injector in a first gas tube, such as at least one of the first gas tube 108 or other suitable gas tube. At 504, a second gas is heated using a heating device to produce a heated gas. The second gas is at least one of the second gas 304 or other suitable gas. The heating device is at least one of the heating device 306 or other suitable heating device. The heated gas is at least one of the heated gas 152 or other suitable gas. At 506, the heated gas is conducted to a heating enclosure enclosing the gas injector to increase a temperature of the first gas in the gas injector from the first temperature to a second temperature. The heating enclosure is at least one of the heating enclosure 106 or other suitable heating enclosure. In some embodiments, the heated gas is conducted to the heating enclosure in a second gas tube, such as at least one of the second gas tube 102 or other suitable gas tube. At 508, the first gas is injected into the wafer treatment chamber from the gas injector after increasing the temperature of the first gas to the second temperature. The first gas is used for treatment of the wafer. In some embodiments, a plasma, such as at least one of the plasma 144 or other suitable plasma, is established in the wafer treatment chamber from the first gas. The plasma is used for the treatment of the wafer.

Figure 6:
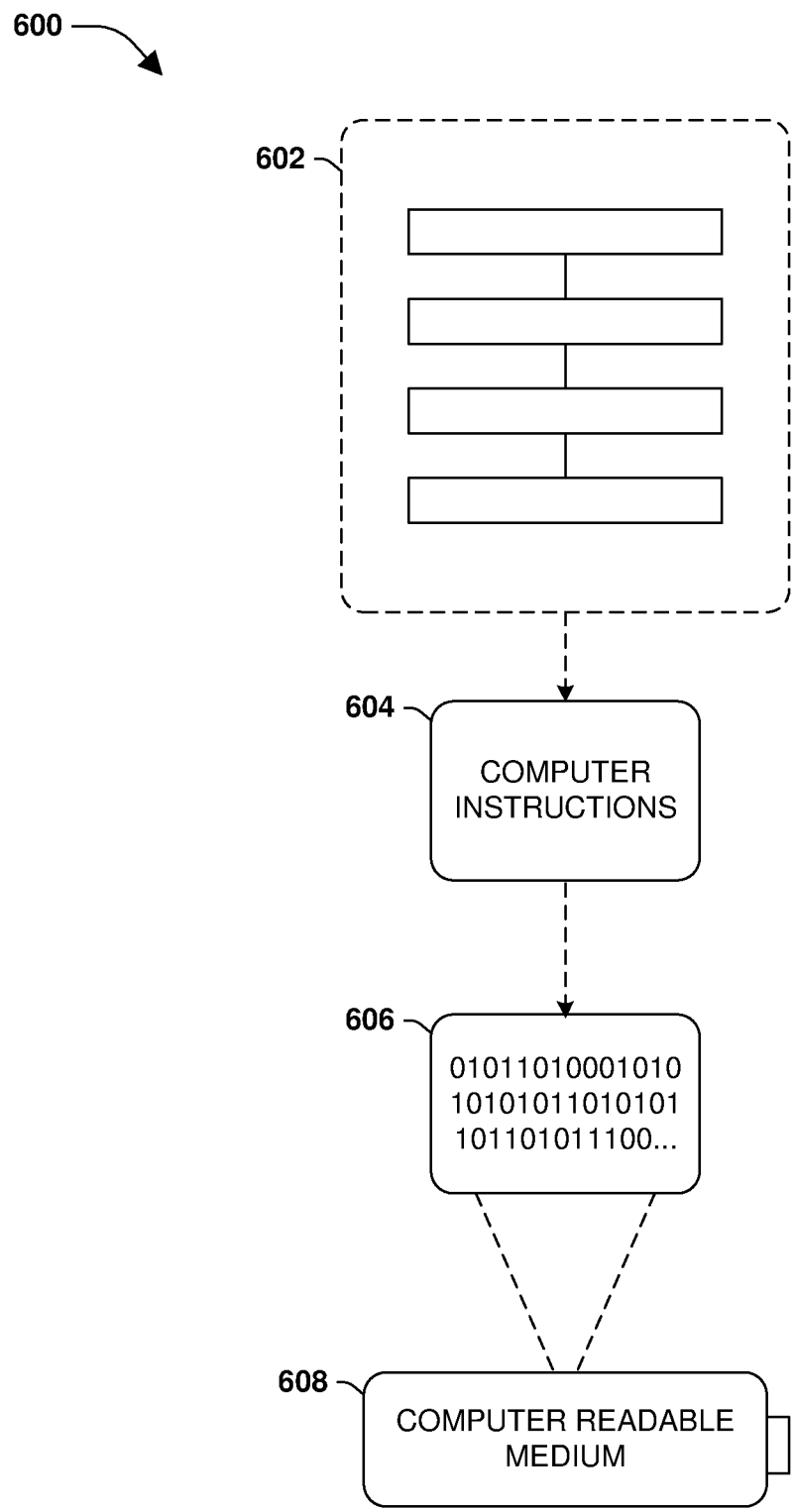
FIG. 6 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 6, wherein the embodiment 600 comprises a computer-readable medium 608 (e.g., a CD-R, DVD-R, flash drive, a platter of a hard disk drive, etc.), on which is encoded computer-readable data 606. This computer-readable data 606 in turn comprises a set of processor-executable computer instructions 604 configured to implement one or more of the principles set forth herein when executed by a processor. In some embodiments 600, the processor-executable computer instructions 604 are configured to implement a method 602, such as at least some of the aforementioned method(s) when executed by a processor. In some embodiments, the processor-executable computer instructions 604 are configured to implement a system, such as at least some of the one or more aforementioned system(s) when executed by a processor. Many such computer-readable media may be devised by those of ordinary skill in the art that are configured to operate in accordance with the techniques presented herein.

In some embodiments, a wafer treatment system is provided. The wafer treatment system includes a wafer treatment chamber defining a treatment area within which a wafer is treated. The wafer treatment system includes a wafer support in the wafer treatment chamber. The wafer support is configured to support a wafer in the treatment area. The wafer treatment system includes a gas injection system. The gas injection system includes a gas injector coupled to the wafer treatment chamber. The gas injector is configured to inject a first gas into the treatment area. The first gas is used for treatment of the wafer. The gas injection system includes a first gas tube configured to conduct the first gas at a first temperature to the gas injector. The gas injection system includes a heating enclosure enclosing the gas injector. The gas injection system includes a second gas tube configured to conduct a heated gas to the heating enclosure to increase an enclosure temperature at the heating enclosure from a first enclosure temperature to a second enclosure temperature. A temperature of the first gas is increased in the gas injector from the first temperature to a second temperature due to the second enclosure temperature at the heating enclosure.

In some embodiments, a gas injection system is provided. The gas injection system includes a gas injector coupled to a wafer treatment chamber. The gas injector is configured to inject a first gas into a treatment area defined by the wafer treatment chamber. The first gas is used for treatment of a wafer in the treatment area. The gas injection system includes a first gas tube configured to conduct the first gas at a first temperature to the gas injector. The gas injection system includes a heating enclosure enclosing the gas injector. The gas injection system includes a second gas tube configured to conduct heated gas to the heating enclosure to increase an enclosure temperature at the heating enclosure from a first enclosure temperature to a second enclosure temperature. A temperature of the first gas is increased in the gas injector from the first temperature to a second temperature due to the second enclosure temperature at the heating enclosure.

In some embodiments, a method of controlling a temperature of a first gas used for treating a wafer is provided. The method includes conducting the first gas at a first temperature to a gas injector coupled to a wafer treatment chamber containing the wafer. The method includes heating a second gas using a heating device to produce a heated gas. The method includes conducting the heated gas to a heating enclosure enclosing the gas injector to increase a temperature of the first gas in the gas injector from the first temperature to a second temperature. The method includes injecting, after increasing the temperature of the first gas to the second temperature, the first gas into the wafer treatment chamber from the gas injector, wherein the first gas is used for treatment of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one other, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A wafer treatment system, comprising:
   a wafer treatment chamber defining a treatment area within which a wafer is treated;
   a wafer support in the wafer treatment chamber and configured to support the wafer in the treatment area;
   a gas injection system, comprising:
      a gas injector coupled to the wafer treatment chamber and configured to inject a first gas into the treatment area, wherein the first gas is used for treatment of the wafer;
      a first gas tube configured to conduct the first gas at a first temperature to the gas injector;
      a heating enclosure enclosing the gas injector for heating the first gas, wherein the gas injector extends from a top wall of the heating enclosure to at least a bottom of the heating enclosure;
      a heating device configured to heat a second gas to produce heated gas; and
      a second gas tube configured to conduct the heated gas from the heating device to the heating enclosure to increase an enclosure temperature at the heating enclosure from a first enclosure temperature to a second enclosure temperature, wherein a temperature of the first gas is increased in the gas injector from the first temperature to a second temperature due to the second enclosure temperature at the heating enclosure; and
   a transformer coupled plasma (TCP) coil disposed entirely above the wafer treatment chamber, wherein a first portion of the TCP coil is disposed with in the heating enclosure and a second portion of the TCP coil is disposed outside the heating enclosure.

2. The wafer treatment system of claim 1, comprising:
   a power generator coupled to the wafer treatment chamber and configured to generate a radio frequency (RF) power to establish a plasma in the treatment area from the first gas, wherein the plasma is used for the treatment of the wafer.

3. The wafer treatment system of claim 1, wherein:
   the treatment comprises etching.

4. The wafer treatment system of claim 1, wherein:
   the first gas comprises silicon tetrachloride ($SiCl_4$); and
   the second temperature is at least 56 degrees Celsius.

5. The wafer treatment system of claim 1, wherein:
   the first gas is at a first pressure in the first gas tube;
   the first gas is at a second pressure in the gas injector;
   the first gas is in a gaseous state at the second pressure and the second temperature; and
   the first gas is in a non-gaseous state at the first pressure and the first temperature.

6. The wafer treatment system of claim 1, wherein:
   the second gas comprises clean dry air (CDA).

7. The wafer treatment system of claim 1, wherein:
   at least one of the heating enclosure or the second gas tube comprise non-conductive material.

8. The wafer treatment system of claim 7, wherein:
   the non-conductive material comprises polytetrafluoroethylene (PTFE).

9. A wafer treatment system, comprising:
   a gas injection system, comprising:
      a gas injector coupled to a wafer treatment chamber and configured to inject a first gas into a treatment area defined by the wafer treatment chamber, wherein the first gas is used for treatment of a wafer in the treatment area;
      a first gas tube configured to conduct the first gas at a first temperature to the gas injector;
      a heating enclosure enclosing the gas injector and the first gas tube for heating the first gas such that the first gas flows through the first gas tube and the gas injector inside the heating enclosure; and
      a second gas tube configured to conduct heated gas to the heating enclosure to increase an enclosure temperature at the heating enclosure from a first enclosure temperature to a second enclosure temperature, wherein a temperature of the first gas is increased in the gas injector from the first temperature to a second temperature due to the second enclosure temperature at the heating enclosure; and
   a transformer coupled plasma (TCP) coil disposed entirely above the wafer treatment chamber, wherein a first portion of the TCP coil is disposed within the heating enclosure and a second portion of the TCP coil is disposed outside the heating enclosure.

10. The wafer treatment system of claim 9, wherein:
    the treatment comprises etching.

11. The wafer treatment system of claim 9, wherein:
    the first gas comprises silicon tetrachloride ($SiCl_4$); and
    the second temperature is at least 56 degrees Celsius.

12. The wafer treatment system of claim 9, wherein:
    the first gas is at a first pressure in the first gas tube;
    the first gas is at a second pressure in the gas injector; and
    the first gas is in a gaseous state at the second pressure and the second temperature.

13. The wafer treatment system of claim 9, comprising:
    a heating device configured to heat a second gas to produce the heated gas based upon a pressure of the first gas.

14. The wafer treatment system of claim 13, wherein:
    the second gas comprises clean dry air (CDA).

15. The wafer treatment system of claim 9, wherein:
    at least one of the heating enclosure or the second gas tube comprise non-conductive material.

16. The wafer treatment system of claim 15, wherein:
    the non-conductive material comprises polytetrafluoroethylene (PTFE).

17. A wafer treatment system, comprising:
    a wafer treatment chamber defining a treatment area within which a wafer is treated;
    a gas injection system, comprising:
       a gas injector coupled to the wafer treatment chamber and configured to inject a first gas into the treatment area; and
       a heating enclosure enclosing the gas injector for heating the first gas; and
    a transformer coupled plasma (TCP) coil disposed entirely above the wafer treatment chamber, wherein:

a first portion of the TCP coil is disposed within the heating enclosure and a second portion of the TCP coil is disposed outside the heating enclosure, and the TCP coil is configured to facilitate generation of plasma using the first gas for treatment of the wafer in the treatment area.

18. The wafer treatment system of claim 17, wherein the gas injection system comprises a gas tube configured to conduct a heated gas to the heating enclosure.

19. The wafer treatment system of claim 18, wherein the first gas is isolated from the heated gas by the gas injector.

20. The wafer treatment system of claim 1, wherein the TCP coil is configured to facilitate generation of plasma using the first gas for the treatment of the wafer in the treatment area.

* * * * *